United States Patent
Vashchenko et al.

(10) Patent No.: US 8,405,123 B2
(45) Date of Patent: Mar. 26, 2013

(54) SPLIT-GATE ESD DIODES WITH ELEVATED VOLTAGE TOLERANCE

(75) Inventors: Vladislav Vashchenko, Palo Alto, CA (US); Konstantin G. Korablev, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 615 days.

(21) Appl. No.: 12/290,083

(22) Filed: Oct. 27, 2008

(65) Prior Publication Data
US 2010/0102391 A1    Apr. 29, 2010

(51) Int. Cl.
H01L 29/70    (2006.01)
H01L 21/28    (2006.01)

(52) U.S. Cl. ......... 257/173; 257/175; 257/355; 257/365

(58) Field of Classification Search .................. 257/173, 257/175, 355, 365, E29.171
See application file for complete search history.

(56) References Cited

U.S. PATENT DOCUMENTS

| | | | |
|---|---|---|---|
| 6,194,233 B1* | 2/2001 | Bedner et al. | 438/14 |
| 6,792,578 B1* | 9/2004 | Brown et al. | 257/356 |
| 7,056,761 B1* | 6/2006 | Vashchenko et al. | 438/91 |
| 7,064,418 B2* | 6/2006 | Li et al. | 257/656 |
| 7,378,327 B2* | 5/2008 | Kao | 438/379 |
| 7,508,050 B1* | 3/2009 | Pei et al. | 257/616 |
| 7,615,417 B2* | 11/2009 | Manna et al. | 438/133 |
| 2005/0035410 A1* | 2/2005 | Yeo et al. | 257/355 |
| 2007/0252212 A1* | 11/2007 | Onsongo et al. | 257/355 |
| 2008/0290367 A1* | 11/2008 | Su et al. | 257/173 |
| 2009/0001472 A1* | 1/2009 | Salman et al. | 257/355 |

* cited by examiner

Primary Examiner — Long Tran
Assistant Examiner — Jordan Klein
(74) Attorney, Agent, or Firm — Eugene C. Conser; Wade J. Brady, III; Frederick J. Telecky, Jr.

(57) ABSTRACT

In a gated diode ESD protection structure, the gate is split into two parts to divide the total reverse voltage between two gate regions.

8 Claims, 3 Drawing Sheets

SPLIT-GATE ESD DIODES WITH ELEVATED VOLTAGE TOLERANCE

FIELD OF THE INVENTION

The invention relates to Electrostatic Discharge (ESD) protection devices. In particular it relates to diode based ESD protection devices.

BACKGROUND OF THE INVENTION

In a quest for faster and smaller footprint ESD protection devices for I/O pins, gated diodes as illustrated in FIG. 2 are being used instead of conventional to composite diodes as shown in FIG. 1. The conventional composite diode of FIG. 1 includes a p+ region 100 separated from an n+ region 102 by a composite 104, which in this case is 0.28 um in length. The gate diode of FIG. 2, also includes a p+ region 200 and an n+ region 202 but in this case the p+ and n+ regions are spaced apart by a gate 204. TCAD simulations have shown definite advantages of gated diodes over composite diodes, including improved forward recovery and ESD current. In fact, experimental results have shown a 40% increase in forward current over conventional composite diodes.

Nevertheless, these diodes have their own drawbacks, largely due to long term reliability of the gate oxide due to hot carrier degradation, resulting in reduced voltage tolerance. Essentially the voltage is limited by the maximum gate voltage of the corresponding standard NMOS and PMOS devices in the process as defined by the gate oxide.

The present invention seeks to address this problem by providing a gated diode with higher voltage tolerance.

SUMMARY OF THE INVENTION

According to the invention there is provided a gated diode ESD protection structure, comprising a p+ region, an n+ region, a first gate structure connected to p+ region, and a second gate structure connected to the n+ region.

The first and second gate structures may comprise polysilicon structures and may be isolated from each other, for example by means of one or more nitride spacers. The first and second gate structures may each be substantially half the length of a single gate gated diode with similar forward current-voltage characteristics. The lengths of the first and second gate structures may each be 0.13 um. Each gate structure may be provided with an isolating nitride spacer.

Further, according to the invention, there is provided a method of increasing the reverse voltage breakdown of a gated diode, comprising splitting the gate of the diode into two sections. The one section may be connected to the to anode of the diode and the other section may be connected to the cathode of the diode. The sections may be isolated from each other, e.g., by means of nitride spacers formed along the sides of one or both of the gate sections.

Still further according to the invention, there is provided a gated diode ESD protection structure, comprising a p+ region forming an anode of the gated diode, an n+ region forming a cathode of the gated diode and spaced from the p+ region to define a channel between the n+ region and the p+ region, and a first gate structure and a second gate structure formed above the channel. At least one of the first gate structure and the second gate structure may be implemented as a floating gate.

DETAILED DESCRIPTION OF THE INVENTION

Figure 3:
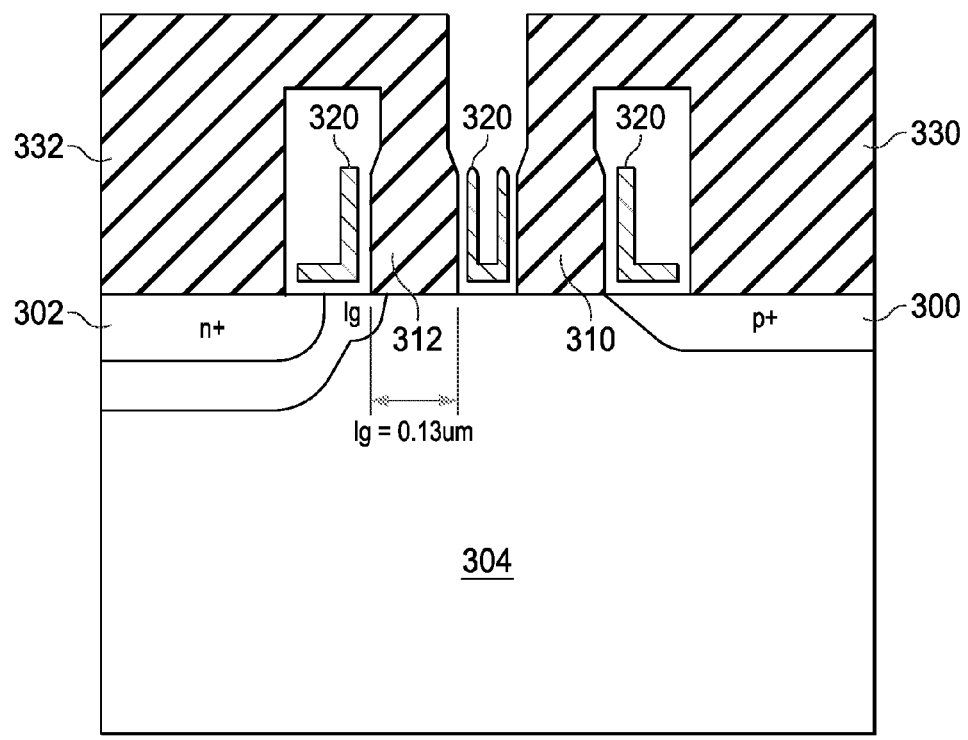
FIG. 3 a cross-section through one embodiment of a split gate diode of the invention.

One embodiment of the invention is shown in FIG. 3, which shows a p+ region 300 and an n+ region 302 formed in a substrate 304. A double or split polysilicon gate comprising a first gate structure 310 and a second gate structure 312 is formed between the p+ region 300 and n+ region 302. As shown in FIG. 3, the gate structures 310, 312 are isolated from each other by a nitride spacer 320 formed on either side of each of the gate structures. In this embodiment, the first gate structure 310 is connected to the p+ region 300, in this case by means of a metal interconnect 330, while the second gate structure 312 is connected by metal interconnect 332 to the n+ region 302. In another embodiment one of the gate structures was implemented to remain floating by not connecting it to either the n+ nor the p+ region. In yet another embodiment both of the gate structures were implemented as floating gate structures.

Figure 1:
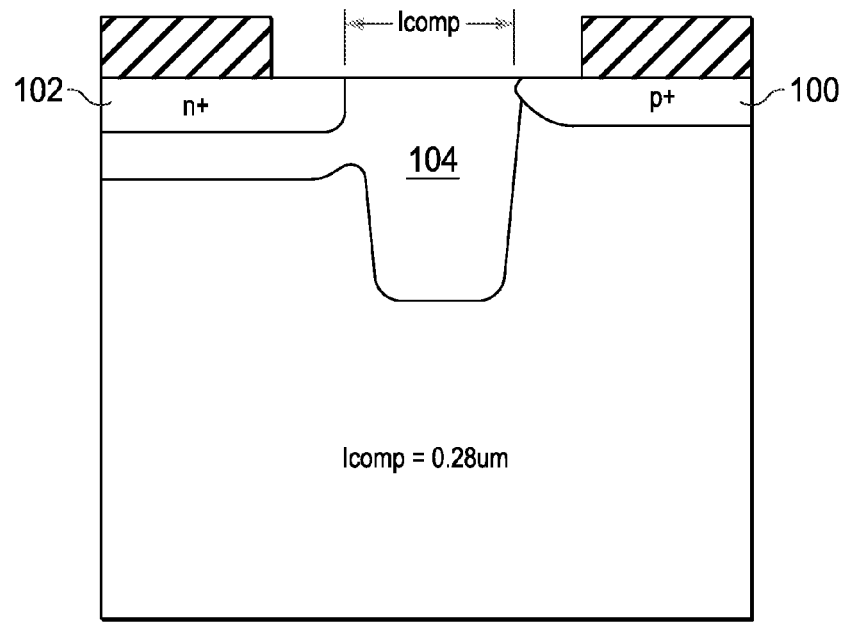
FIG. 1 is a cross-section through a prior art composite diode.
Figure 2:
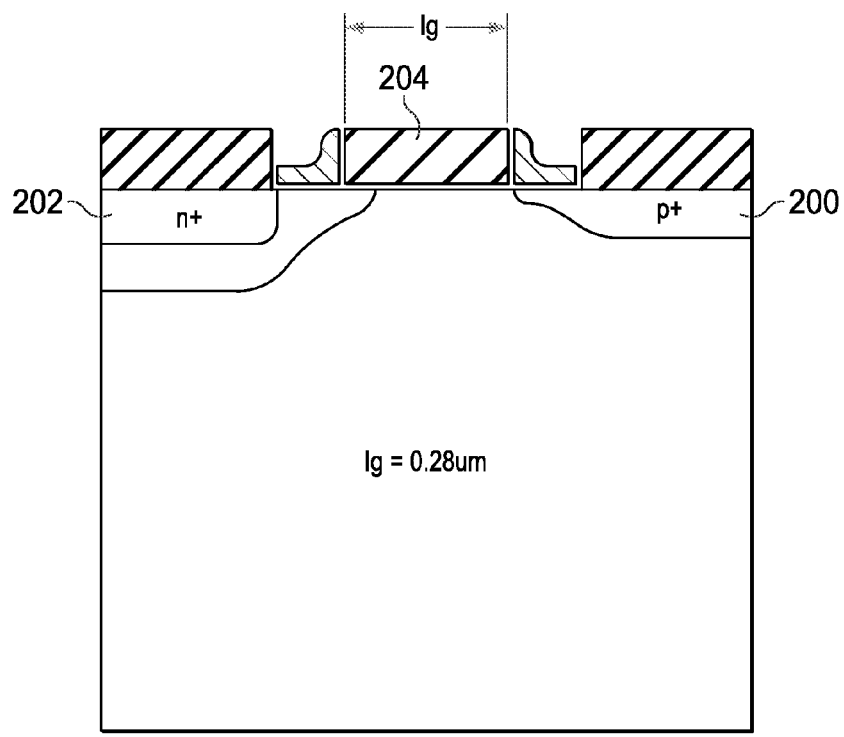
FIG. 2 is a cross-section through a prior art gated diode.
Figure 4:
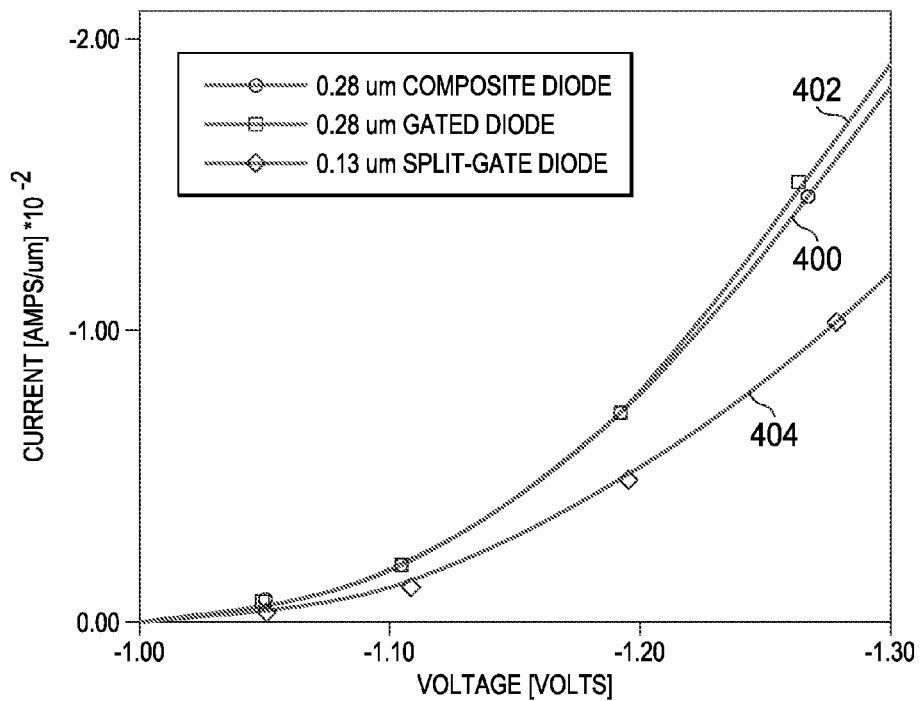
FIG. 4 shows forward current-voltage curves for one embodiment of the invention compared to a prior art composite diode and a prior art gated diode.
Figure 5:
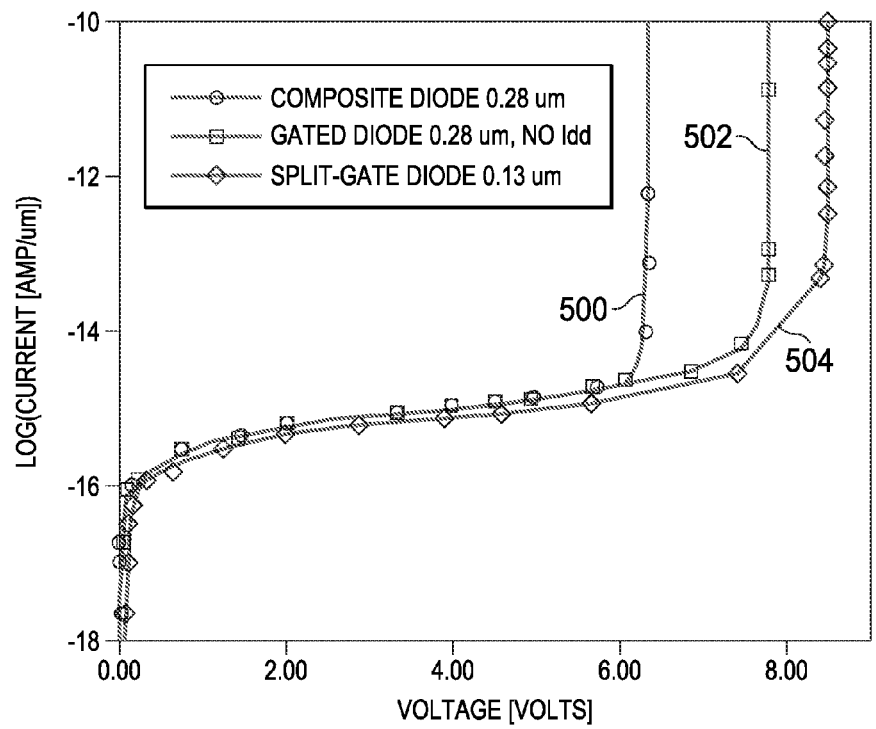
FIG. 5 shows breakdown characteristics for one embodiment of the invention compared to a prior art composite diode and a prior art gated diode.

In the embodiment of FIG. 3 the length lg of each of the two gate structures 310, 312 is 0.13 um. This can be compared to the gate length of 0.28 um for a comparable prior art gate diode as shown in FIG. 2. TCAD simulations provide a comparison between a gated diode structure as shown in FIG. 2 with the split gate diode structure of FIG. 3. As shown in FIG. 4, the forward current-voltage characteristics for a split gate diode (curve 400) of the present invention with two 0.13 um polysilicon gates are similar to those for a prior art gate diode with a 0.28 um gate (curve 402). Thus the splitting of the gate has not substantially detracted from the forward ESD current benefits of a gated diode over a composite diode (curve 404). On the other hand, the split gate diode of the present invention shows a substantial improvement in the breakdown characteristics over the prior art gated diode. This is illustrated in FIG. 5, which shows the reverse current-voltage characteristics on a log scale for a split gate diode of the invention with two 0.13 um gate structures (curve 500) compared to a prior art gated diode (curve 502). The corresponding curve for a composite diode as shown in FIG. 1, is given by curve 504.

The high reverse breakdown characteristics of the split gate diode of the present invention coupled with the improved forward current characteristics compared to standard composite diodes makes the diodes of the present invention particularly well suited for applications where the speed of an I/O is critical and parasitic of the I/O diodes are major limiting factor.

By providing substantially stronger reverse breakdown characteristics compared to prior art gated diodes, the present invention allows scaling ESD diodes to smaller sizes and thus providing correspondingly high speed performance for I/Os operating at 10 GHz and more.

What is claimed is:
1. A gated diode ESD protection structure, comprising
a p+ region formed in a substrate material,
an n+ region formed in the substrate material and separated from the p+ region to define a channel region between the p+ region and the n+ region, a first gate structure formed over the channel region and connected to the p+ region by means of a metal interconnect, and a second gate structure formed over the channel region and connected to the n+ region by means of a metal interconnect.

2. A gated diode ESD protection structure of claim 1, wherein the first and second gate structures comprise polysilicon structures.

3. A gated diode ESD protection structure of claim 2, wherein the gate structures are isolated from each other.

4. A gated diode ESD protection structure of claim 3, wherein the gate structures are isolated from each other by means of one or more nitride spacers.

5. A gated diode ESD protection structure of claim 1, wherein the first and second gate structures are each substantially half the length of the gate of a single gate gated diode with similar forward current-voltage characteristics.

6. A gated diode ESD protection structure of claim 1, wherein the lengths of the first and second gate structures are each substantially 0.13 μm.

7. A gated diode ESD protection structure of claim 1, wherein each gate structure is provided with an isolating nitride spacer.

8. A gated diode ESD protection structure, comprising a p+ region forming an anode of the gated diode, an n+ region forming a cathode of the gated diode and spaced from the p+ region by a channel defined by a single uniform region between the n+ region and the p+ region, and a first gate structure and a second gate structure, wherein the first gate structure and second gate structure are formed from the same material, are isolated from each other, and are formed above the channel.

* * * * *